(12) United States Patent
Kim

(10) Patent No.: US 9,312,872 B1
(45) Date of Patent: Apr. 12, 2016

(54) SIGNAL CONVERTER

(71) Applicant: SK hynix Inc., Gyeonggi-do (KR)

(72) Inventor: Ji-Hwan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/845,023

(22) Filed: Sep. 3, 2015

(30) Foreign Application Priority Data

Apr. 14, 2015 (KR) .................. 10-2015-0052438

(51) Int. Cl.
*H03M 1/50* (2006.01)
*H03M 1/00* (2006.01)
*H03M 1/60* (2006.01)
*G04F 10/00* (2006.01)

(52) U.S. Cl.
CPC ............ *H03M 1/00* (2013.01); *G04F 10/005* (2013.01); *H03M 1/50* (2013.01); *H03M 1/60* (2013.01)

(58) Field of Classification Search
CPC .......... H03M 1/50; H03M 1/60; G04F 10/005

USPC .................................................. 341/126, 166
See application file for complete search history.

(56) References Cited

U.S. PATENT DOCUMENTS

| | | | | |
|---|---|---|---|---|
| 5,982,841 A | * | 11/1999 | Terada | G01R 29/027 377/20 |
| 7,336,210 B2 | * | 2/2008 | Lazar | H03M 1/121 341/100 |
| 9,092,013 B2 | * | 7/2015 | Song | G04F 10/005 |
| 9,213,316 B2 | * | 12/2015 | Suma Vinay | G04F 10/005 |

FOREIGN PATENT DOCUMENTS

KR 1020110098505 9/2011

* cited by examiner

*Primary Examiner* — Khai M Nguyen
(74) *Attorney, Agent, or Firm* — IP & T Group LLP

(57) ABSTRACT

A signal converter may include: a clock generation unit suitable for generating a counting clock signal having a given period value; a signal dividing unit suitable for dividing an input signal having time information by a preset division value correlated with the given period value; and a counting unit suitable for generating a counting value by counting an output signal of the signal dividing unit in response to the counting clock signal.

18 Claims, 5 Drawing Sheets

SIGNAL CONVERTER

CROSS-REFERENCE TO RELATED APPLICATIONS

The present application claims priority of Korean Patent Application No. 10-2015-0052438, filed on Apr. 14, 2015, which is incorporated herein by reference in its entirety.

BACKGROUND

1. Field

The present invention relates to a semiconductor design technology, and more particularly, to a signal converter for converting an input signal into a desired signal type.

2. Description of the Related Art

Semiconductor devices such as Double Data Rate Synchronous Dynamic random access memory (DDR SDRAM) convert input signals from an external source (hereafter, referred to as an input signal) into a desired signal type for use. The operation of converting the input signal is performed by a signal converter. There are different types of signal converters including Digital-to-Analog Converter (DAC), an Analog-to-Digital Converters (ADC), Time-to-Digital Converters (TDC) and the like, depending on the types of input and output signals. The DAC converts a digital input signal into an analog output signal, the ADC converts an analog input signal into a digital output signal, and the TDC converts a temporal input signal into a digital output signal. The temporal input signal inputted to the TDC has time information. Examples of the temporal input signals include a signal having a pulse width corresponding to the time information.

Recent semiconductor devices have required more rapid and precise operations. Thus, semiconductor device designers need to be sensitive to even small amounts of noise to avoid errors. When designing a signal converter, designers must consider such aspects, which generally makes their job more difficult. Hereafter, a signal converter capable of improving such concerns will be described.

SUMMARY

Various embodiments are directed to a signal converter having an operation factor set to a predetermined value.

In accordance with an embodiment of the present invention, a signal converter may include: a clock generation unit suitable for generating a counting clock signal having a given period value; a signal dividing unit suitable for dividing an input signal having time information by a preset division value correlated with the given period value; and a counting unit suitable for generating a counting value by counting an output signal of the signal dividing unit in response to the counting clock signal.

The preset division value may comprise a multiple of the given period value.

The clock generation unit may comprise a plurality of unit delays, each having a delay amount corresponding to the given period value.

The number of the unit delays may correspond to the preset division value.

In accordance with another embodiment of the present invention, a signal converter may include: a control unit suitable for setting a division value and a period value that are correlated; a signal dividing unit suitable for dividing an input signal having time information by the division value; a clock generation unit suitable for generating a counting clock signal having the period value; and a counting unit suitable for generating a counting value by counting an output signal of the signal dividing unit in response to the counting clock.

The control unit may set the division value to a multiple of the period value.

The clock generation unit may include: a plurality of oscillators suitable for generating oscillation signals having period values corresponding to different delay amounts, respectively; and a clock selector suitable for selecting any one of the oscillation signals generated from the respective oscillators in response to an output signal of the control unit, and outputting the selected oscillation signal as the counting clock signal.

Each of the plurality of oscillators may comprise a plurality of unit delays having the different delay amounts.

The number of the unit delays may correspond to the division value.

The signal dividing unit may include: a plurality of dividers suitable for dividing the input signal by different division values, respectively; and a division ratio selector suitable for selecting any one of output signals of the respective dividers in response to an output signal of the control unit.

In accordance with yet another embodiment of the present invention, a signal converter may include: a signal dividing unit suitable for dividing an input signal having time information by a preset division value; a pulse detection unit suitable for generating a detection signal by detecting a pulse width of the input signal; a clock generation unit suitable for outputting an oscillation signal corresponding to the detection signal, among a plurality of oscillation signals having a plurality of period values correlated with the preset division value, as a counting clock signal; and a counting unit suitable for generating a counting value by counting an output signal of the signal dividing unit in response to the counting clock.

The plurality of period values may comprise submultiples of the division value.

The clock generation unit may include: a plurality of oscillators suitable for generating oscillation signals having period values corresponding to different delay amounts, respectively; and a clock selector suitable for selecting any one of oscillation signals of the respective oscillators as the counting clock signal in response to the detection signal.

Each of the plurality of oscillators may comprise a plurality of unit delays having the different delay amounts.

The number of the unit delays may correspond to the division value.

In accordance with yet another embodiment of the present invention, a signal converter may include: a clock generation unit suitable for generating a counting clock signal having a given period value; a pulse detection unit suitable for generating a detection signal by detecting a pulse width of an input signal having time information; a signal dividing unit suitable for dividing the input signal by a division value corresponding to the detection signal among a plurality of division values correlated with the given period value; and a counting unit suitable for generating a counting value by counting an output signal of the signal dividing unit in response to the counting clock.

The plurality of division values may comprise multiples of the period value.

The signal dividing unit may include: a plurality of dividers suitable for dividing the input signal by different division values, respectively; and a division ratio selector suitable for selecting any one of output signals of the respective dividers in response to the detection signal.

The signal converter may have a systematic relation between the division value of the input signal and the period value of the counting clock which are operation factors.

DETAILED DESCRIPTION

Figure 1:
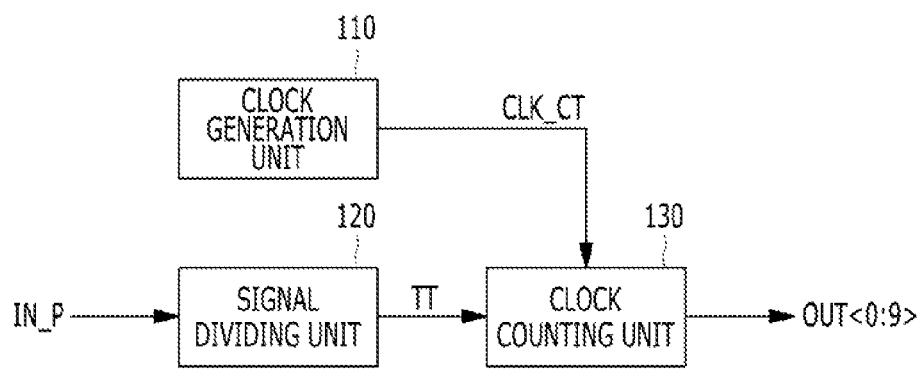
FIG. 1 is a block diagram for describing a signal converter in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram for describing a signal converter in accordance with an embodiment of the present invention.

Referring to FIG. 1, the signal converter may include a clock generation unit 110, a signal dividing unit 120, and a clock counting unit 130.

The clock generation unit 110 may generate a counting clock signal CLK_CT having a given period value, and provide the generated counting clock signal to the clock counting unit 130. The period value may indicate a value corresponding to one period of the counting clock signal CLK_CT.

The signal dividing unit 120 may divide an input signal IN_P by a preset division value through a dividing operation. The input signal IN_P is a signal having time information, and may correspond to a pulse signal activated during a predetermined time. The dividing operation may indicate an operation of dividing a frequency of the input signal IN_P by the preset division value. Thus, an output signal of the signal dividing unit 120 may have a lower frequency than the input signal IN_P.

The clock counting unit 130 may count the output signal TT of the signal dividing unit 120 in response to the counting clock signal CLK_CT, and generate a counting value OUT<0:9>. The counting value OUT<0:9> may be digital.

Herein, an operation factor of the clock generation unit 110 may be correlated with an operation factor of the signal dividing unit 120. The operation factor of the clock generation unit 110 may indicate the given period value of the counting clock signal CLK_CT, and the operation factor of the signal dividing unit 120 may indicate the preset division value reflected on the input signal IN_P.

In the signal converter in accordance with the embodiment of the present invention, the given period value and the preset division value serving as the operation factors may be systematically designed to increase the accuracy of the conversion operation.

Figure 2:
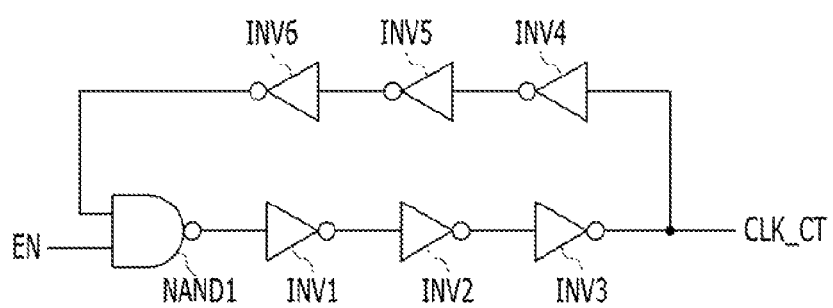
FIG. 2 is a circuit diagram for describing a clock generation unit of FIG. 1.

FIG. 2 is a circuit diagram for describing the clock generation unit 110 of FIG. 1.

Referring to FIG. 2, the clock generation unit 110 may generate the counting clock signal CLK_CT in response to an enable signal EN, and include a NAND gate NAND1 and first to sixth NOT gates INV1 to INV6.

Hereafter, the circuit operation of FIG. 2 will be briefly described. For convenience, suppose that the NAND gate NAND1 and the first to sixth NOT gates INV1 to INV6 have the same unit delay amount. That is, the dock generation unit 110 may have seven unit delay amounts through one NAND gate NAND1 and six NOT gates INV1 to INV6. Furthermore, each of the NAND gate NAND1 and the first to sixth NOT gates INV1 to INV6 which are designed for seven unit delay amounts will be referred to as a unit delay.

First, when the enable signal EN is activated, the counting clock signal CLK_CT may toggle. At this time, since the counting clock signal CLK_CT maintains an activation period for seven unit delays, that is, the NAND gate NAND1 and the first to sixth NOT gates INV1 to INV6, the counting clock signal CLK_CT may have a period value corresponding to seven unit delays. That is, the period value of the counting clock signal CLK_CT may be set to a delay amount of 7 corresponding to seven unit delay amounts. For reference, the delay amount of 7 may correspond to a half period of the counting clock signal CLK_CT, but the half period of the counting clock signal CLK_CT may correspond to one period of the counting clock signal CLK_CT when the counting clock signal CLK_CT has an ideal duty ratio. Thus, in the present specification, this configuration is 'the counting clock signal CLK_CT having a period value corresponding to the delay amount of 7'.

Figure 3:
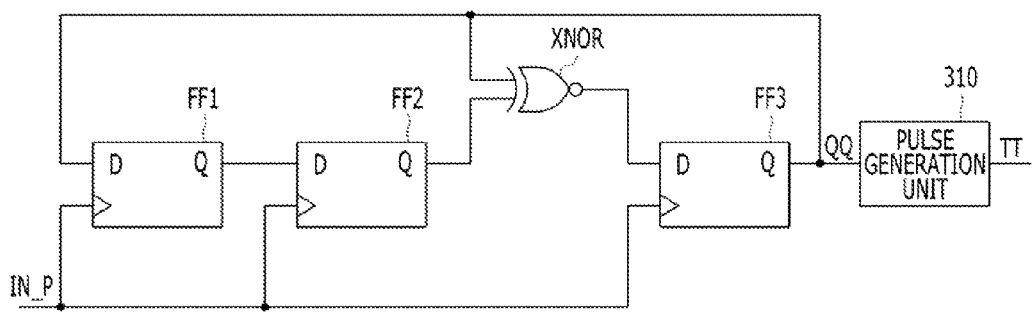
FIG. 3 is a circuit diagram for describing a signal dividing unit of FIG. 1.

FIG. 3 is a circuit diagram for describing the signal dividing unit 120 of FIG. 1.

Referring to FIG. 3 the signal dividing unit 120 may divide the input signal IN_P by the preset division value, and include first to third flip-flops FF1 to FF3, an XNOR gate XNOR, and a pulse generator 310. The signal dividing unit 120 of FIG. 3 may include a circuit which divides the input signal IN_P by 7 and generates the output signal TT of the signal dividing unit 120. The configuration of the signal dividing unit 120 may differ depending on design.

Figure 4:
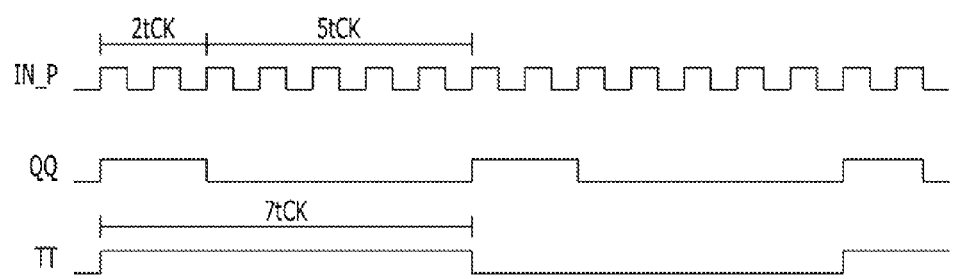
FIG. 4 is a timing diagram for describing a circuit operation of the signal dividing unit of FIG. 3.

FIG. 4 is a timing diagram for describing the circuit operation of the signal dividing unit 120 of FIG. 3.

FIG. 4 illustrates the input signal IN_P, an output signal QQ of the third flip-flop FF3, and the output signal TT of the signal dividing unit 120. As illustrated in FIG. 4, the input signal IN_P may toggle with a period of 1tCK corresponding to predetermined time information, and the output signal TT of the signal dividing unit 120 may be obtained by dividing the input signal IN_P by 7. That is the output signal TT of the signal dividing unit 120 may toggle with a half period of 7tCK. The signal dividing unit 120 may divide the input signal IN_P by 7 through the dividing operation, and the division value of the signal dividing unit 120 may be set to 7 corresponding to the divide-by-7 operation.

As described above, the period value of the counting clock signal CLK_CT may be set to 7 in FIG. 2, and the division value of the signal dividing unit 120 may be set to 7 in FIGS. 3 and 4.

Equation 1, below, expresses the relation between the input signal IN_P and the counting value OUT<0:9>.

$$OUT\langle 0:9\rangle = \frac{IN\_P * DIV\$}{T\$} \qquad [\text{Equation 1}]$$

In Equation 1, 'IN_P' represents a pulse width of the input signal IN_P, 'DIV$' represents the division value of the signal dividing unit 120, and 'T$' represents the period value of the counting clock signal CLK_CT. In the embodiment of FIGS. 2 to 4, T$ is set to 7, and DIV$ is also set to 7. Thus, only a value corresponding to one period of the input signal IN_P serves as a factor defining the counting value OUT<0:9>.

The division value DIV$ of the signal dividing unit 120 may include values obtained by multiplying the period value T$ of the counting clock signal CLK_CT by a natural number, that is, multiples. For example, when the period value T$ is 7, the division value DIV$ may be set to 7, 14, 21 and the like, which are obtained by multiplying 7 by the natural number. For reference, when the division value DIV$ is set to 14, it may indicate that the division value of the signal dividing unit 120 is set to 14. Thus, the signal dividing unit 120 needs to be designed to divide the input signal IN_P by 14.

In a signal converter in accordance with the embodiment of the present invention, the division value of the signal dividing unit 120 and the period value of the counting clock signal CLK_CT may have a systematic relation therebetween. Furthermore, when converting the analog input signal IN_P into the digital counting value OUT<0:9>, the signal converter may remove all factors onto which noise or errors are reflected. Thus, the signal converter may guarantee a more precise conversion operation.

Figure 5:
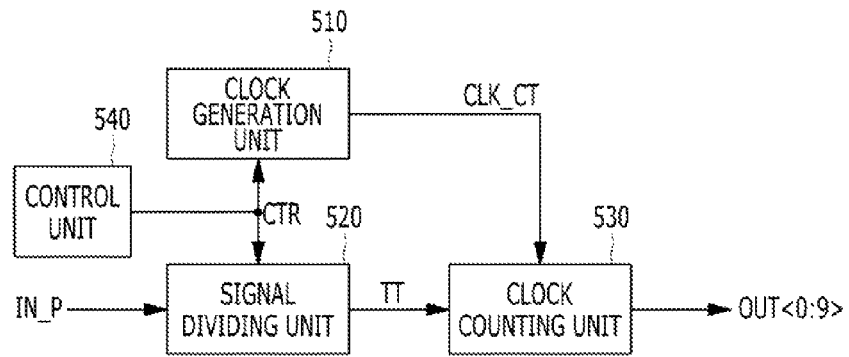
FIG. 5 is a block diagram for describing a signal converter in accordance with another embodiment of the present invention.

FIG. 5 is a block diagram for describing a signal converter in accordance with another embodiment of the present invention.

Referring to FIG. 5, the signal converter may include a clock generation unit 510, a signal dividing unit 520, a clock counting unit 530, and a control unit 540.

The clock generation unit 510 may generate a counting clock signal CLK_CT in response to a period value set by the control unit 540, and provide the generated counting clock signal CLK_CT to the clock counting unit 530. The signal dividing unit 520 may divide the input signal IN_P by a division value set by the control unit 540. The clock counting unit 530 may count an output signal TT of the signal dividing unit 520 in response to the counting clock signal CLK_CT, and generate a counting value OUT<0:9>.

The control unit 540 may generate a control signal CTR for setting the period value of the counting clock signal CLK_CT and the division value of the signal dividing unit 520 such that the period value of the counting clock signal CLK_CT is correlated with the division value of the signal dividing unit 520. That is, the period value of the clock generation unit 510 and the division value of the signal dividing unit 520 may be set in response to the control signal CTR. As described above the division value may be set to a multiple of the period value.

Although not illustrated, the control unit 540 may receive information for generating a desired control signal CTR from a user, and the information may be provided from outside (e.g. an external source) or provided through information stored therein.

The signal converter in accordance with the embodiment of the present invention may adjust and set the period value of the counting clock signal CLK_CT and the division value of the signal dividing unit 520 under the control of the control unit 540.

Figure 6:
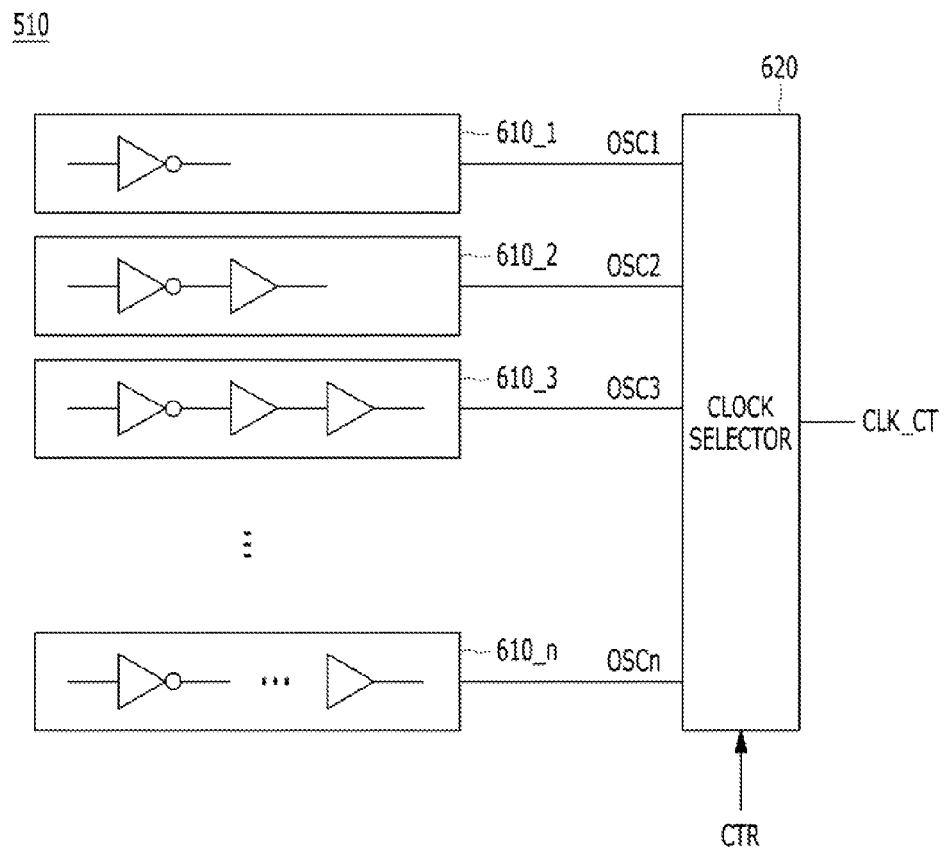
FIG. 6 is a block diagram for describing a clock generation unit of FIG. 5.

FIG. 6 is a block diagram for describing the clock generation unit 510 of FIG. 5.

Referring to FIG. 6, the clock generation unit 510 may include first to nth oscillators 610_1 to 610_n and a clock selector 620, where n is a natural number.

The first to nth oscillators 610_1 to 610_n may generate first to nth oscillation signals OSC1 to OSCn having period values corresponding to different delay amounts, respectively. FIG. 5 conceptually illustrates delay amounts reflected onto the first to nth oscillators 610_1 to 610_n, respectively. That is, the first oscillator 610_1 may use one unit delay to generate the first oscillation signal OSC1. This may indicate that the period value of the first oscillation signal OSC1 is '1' corresponding to one unit delay. Similarly, the second oscillator 610_2 may use two unit delays to generate the second oscillation signal OSC2, and the second oscillation signal OSC2 may have a period value corresponding to '2'. Finally, the nth oscillator 610_n may generate the nth oscillation signal OSCn having a period value corresponding to 'n'.

The clock selector 620 may output one of the first to nth oscillation signals OSC1 to OSCn as the counting clock signal CLK_CT in response to the control signal CTR. The control signal CTR may include a signal to select any one of the first to nth oscillation signals OCS1 to OSCn.

Figure 7:
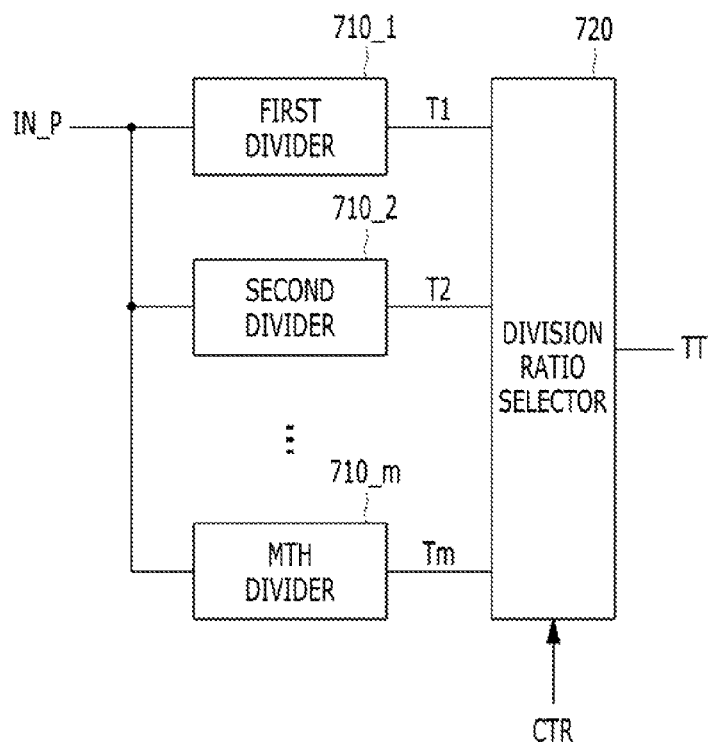
FIG. 7 is a circuit diagram for describing a signal dividing unit of FIG. 5.

FIG. 7 is a circuit diagram for describing the signal dividing unit 520 of FIG. 5.

Referring to FIG. 7, the signal dividing unit 520 may include first to nth dividers 710_1 to 710_m and a division ratio selector 720, where m is a natural number equal to or greater than n.

The first to mth dividers 710_1 to 710_m may generate first to mth divided signals T1 to Tm obtained through different division values, respectively. The first divider 710_1 may have a division value corresponding to '1' and the second divider 710_2 may have a division value corresponding to '2'. Further, the mth divider 710_m may have a division value corresponding to 'm'.

The division ratio selector 720 may output one of the first to mth divided signals T1 to Tm as the output signal TT in response to the control signal CTR.

FIG. 7 illustrates that the signal dividing unit 520 has m dividers. Although already described above the division value may include a multiple of the period value. In this connection, FIG. 7 illustrates that the number of dividers, i.e., m, may be greater than or equal to n. When the number of dividers is greater than n, the number of control signals CTR may differ in order to select the corresponding divided signals.

Figure 8:
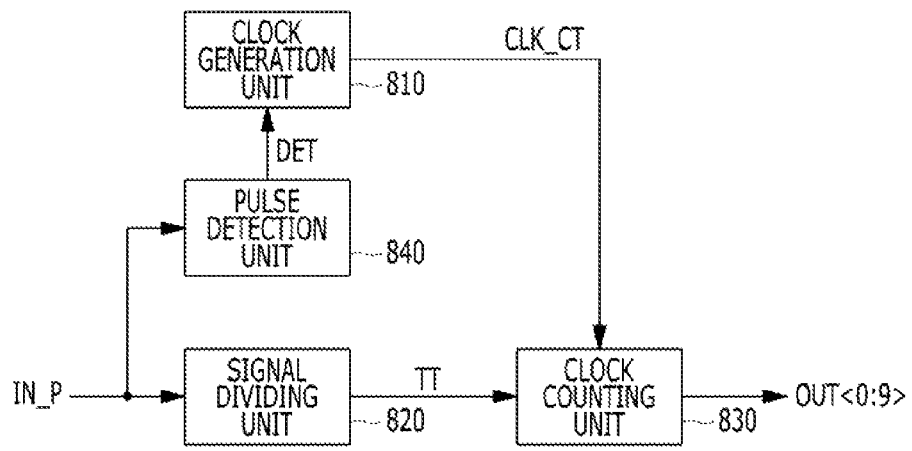
FIG. 8 is a block diagram for describing a signal converter in accordance with another embodiment of the present invention.

FIG. 8 is a block diagram for describing a signal converter in accordance with another embodiment of the present invention.

Referring to FIG. 8, the signal converter may include a clock generation unit 810, a signal dividing unit 820, a clock counting unit 830, and a pulse detection unit 840.

The clock generation unit 810 may generate a plurality of oscillation signals having a plurality of period values correlated with a preset division value which is set in the signal dividing unit 820, and output an oscillation signal having a corresponding period value, among the plurality of oscillation signals, as a counting clock signal CLK_CT in response to a detection signal of the pulse detection unit 840. The signal dividing unit 820 may divide an input signal IN_P by the preset division value. The clock counting unit 830 may count an output signal TT of the signal dividing unit 820 in response to the counting clock signal CLK_CT and generate a counting value OUT<0:9>.

The pulse detection unit 840 may generate the detection signal DET by detecting a pulse width of the input signal IN_P. The detection signal DET may have a different detection result value depending on whether the pulse width of the input signal IN_P is larger or smaller than a predetermined reference pulse width. In the present embodiment, two cases will be used as examples. However, three or more cases may be applied, and the detection signal DET may have different detection result values for three or more cases.

Hereafter, an operation of the signal converter will be briefly described.

First, suppose that the signal dividing unit 820 has a division value of 8 and the clock generation unit 810 generates oscillation signals having period values of 1, 2, 4, and 8. For reference, the configuration and method for generating a plurality of oscillation signals having a plurality of period values and the configuration and method for outputting one of the oscillation signals as the counting clock signal CLK_CT have already been described with reference to FIG. 6.

The period value of 1, 2, 4, and 8 may correspond to a divide-by-8 value or a submultiple of 8. The pulse detection unit 840 may generate the detection signal DET by detecting the pulse width of the input signal IN_P. The clock generation unit 810 may select any one of the period values of 1, 2, 4, and 8 in response to the detection signals DET, and output the selected value as the counting clock signal CLK_CT. The detection signal DET may correspond to the control signal CTR of FIG. 6.

In the embodiment of FIG. 8, the period value may be selected according to the pulse width of the input signal IN_P. When the period value is selected, various advantages may be obtained. For example, when the period value is 8, the period of the counting clock signal CLK_CT may be increased. Thus, the counting value OUT<0:9> may be reduced. In this case, a margin between signals which are used during operation of the signal converter may be sufficiently secured, and the power consumption may be reduced. Furthermore, when the period value is 1, the period of the counting clock signal CLK_CT may be decreased. Thus, the counting value OUT<0:9> may be increased. In this case, the signal converter may obtain a more accurate result value even though the circuit operation is changed by Process, Voltage, and Temperature (PVT) variation.

The signal converter in accordance with the embodiment of the present invention may set the period value of the clock generation unit 810 to a submultiple of the division value according to the pulse width of the input signal IN_P, and perform the signal conversion operation.

Figure 9:
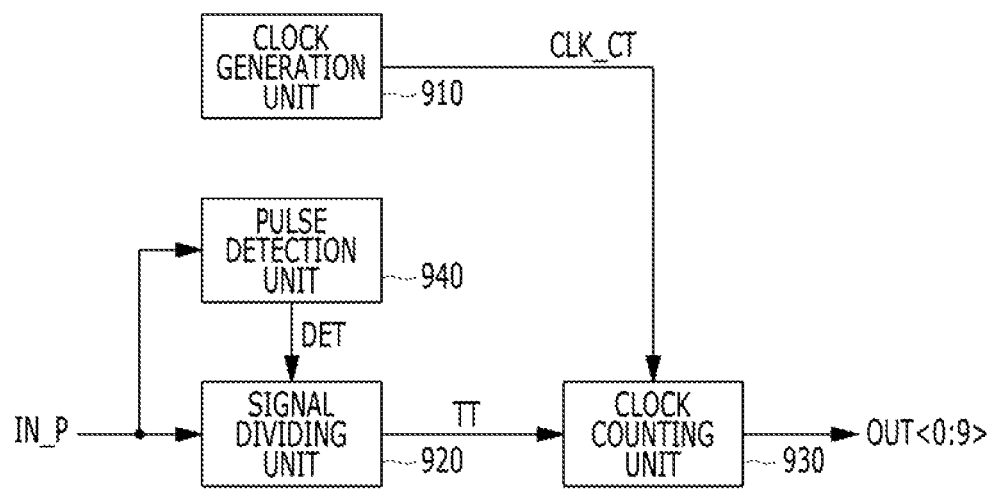
FIG. 9 is a block diagram for describing a signal converter in accordance with another embodiment of the present invention.

FIG. 9 is a block diagram for describing a signal converter in accordance with another embodiment of the present invention.

Referring to FIG. 9, the signal converter may include a clock generation unit 910, a signal dividing unit 920, a clock counting unit 930 and a pulse detection unit 940.

The clock generation unit 910 may generate a counting clock signal CLK_CT having a given period value, and the signal dividing unit 920 may divide an input signal IN_P by a division value in response to a detection signal DET, among a plurality of division values correlated with the given period value. The clock counting unit 930 may count an output signal TT of the signal dividing unit 920 in response to the counting clock signal CLK_CT, and generate a counting value OUT<0:9>. The pulse detection unit 940 may generate the detection signal DET by detecting a pulse width of the input signal IN_P.

Hereafter, an operation of the signal converter will be briefly described.

First, suppose that the clock generation unit 910 has a period value of 3 and the signal dividing unit 920 divides the input signal IN_P by division values of 3, 6, 9, and 12. For reference, the configuration and method for dividing an input signal by a plurality of division values and the configuration and method for outputting one of the divided signals have been already described with reference to FIG. 7.

The division values of 6, 9, and 12 may correspond to the period value of 3 or multiples of 3. The pulse detection unit 940 may generate the detection signal DET by detecting the pulse width of the input signal IN_P. The signal dividing unit 920 may select any one of the division values of 3, 6, 9, and 12 in response to the detection signals DET, and divide the input signal IN_P by the selected division value. The detection signal DET may correspond to the control signal CTR of FIG. 7.

The signal converter in accordance with the embodiment of the present invention may set the division value of the signal dividing unit 920 to a multiple of the period value according to the pulse width of the input signal IN_P, in order to perform the signal conversion operation.

As described above, the signal converter in accordance with the embodiment of the present invention may set the division value of the input signal and the period value of the counting clock such that the division value and the period value have a systematic relation, thereby increasing the precision of the operation.

Although various embodiments have been described for illustrative purposes it will be apparent to those skilled in the art that various changes and modifications may be made without departing from the spirit and scope of the invention as defined in the following claims.

For example, the positions and types of the logic gates and transistors used in the above-described embodiments may be set in different manners according to the polarities of input signals.

What is claimed:

1. A signal converter comprising:
   a clock generation unit suitable for generating a counting clock signal having a given period value;
   a signal dividing unit suitable for dividing an input signal having time information by a preset division value correlated with the given period value; and
   a counting unit suitable for generating a counting value by counting an output signal of the signal dividing unit in response to the counting clock signal.

2. The signal converter of claim 1, wherein the preset division value comprises a multiple of the given period value.

3. The signal converter of claim 1, wherein the clock generation unit comprises a plurality of unit delays, each having a delay amount corresponding to the given period value.

4. The signal converter of claim 3, wherein the number of the unit delays corresponds to the preset division value.

5. A signal converter comprising:
   a control unit suitable for setting a division value and a period value that are correlated;
   a signal dividing unit suitable for dividing an input signal having time information by the division value;
   a clock generation unit suitable for generating a counting clock signal having the period value; and
   a counting unit suitable for generating a counting value by counting an output signal of the signal dividing unit in response to the counting clock.

6. The signal converter of claim 5, wherein the control unit sets the division value to a multiple of the period value.

7. The signal converter of claim 5, wherein the clock generation unit comprises:
   a plurality of oscillators suitable for generating oscillation signals having period values corresponding to different delay amounts, respectively; and a clock selector suitable for selecting any one of the oscillation signals generated from the respective oscillators in response to an output signal of the control unit, and outputting the selected oscillation signal as the counting clock signal.

8. The signal converter of claim 7, wherein each of the plurality of oscillators comprises a plurality of unit delays having the different delay amounts.

9. The signal converter of claim 8, wherein the number of the unit delays corresponds to the division value.

10. The signal converter of claim 5, wherein the signal dividing unit comprises:
a plurality of dividers suitable for dividing the input signal by different division values, respectively; and
a division ratio selector suitable for selecting any one of output signals of the respective dividers in response to an output signal of the control unit.

11. A signal converter comprising:
a signal dividing unit suitable for dividing an input signal having time information by a preset division value;
a pulse detection unit suitable for generating a detection signal by detecting a pulse width of the input signal;
a clock generation unit suitable for outputting an oscillation signal corresponding to the detection signal, among a plurality of oscillation signals having a plurality of period values correlated with the preset division value, as a counting clock signal; and
a counting unit suitable for generating a counting value by counting an output signal of the signal dividing unit in response to the counting clock.

12. The signal converter of claim 11, wherein the plurality of period values comprise submultiples of the division value.

13. The signal converter of claim 11, wherein the clock generation unit comprises:

a plurality of oscillators suitable for generating oscillation signals having period values corresponding to different delay amounts, respectively; and
a clock selector suitable for selecting any one of oscillation signals of the respective oscillators as the counting clock signal in response to the detection signal.

14. The signal converter of claim 13, wherein each of the plurality of oscillators comprise a plurality of unit delays having the different delay amounts.

15. The signal converter of claim 14, wherein the number of the unit delays corresponds to the division value.

16. A signal converter comprising:
a clock generation unit suitable for generating a counting clock signal having a given period value;
a pulse detection unit suitable for generating a detection signal by detecting a pulse width of an input signal having time information;
a signal dividing unit suitable for dividing the input signal by a division value corresponding to the detection signal among a plurality of division values correlated with the given period value; and
a counting unit suitable for generating a counting value by counting an output signal of the signal dividing unit in response to the counting clock.

17. The signal converter of claim 16, wherein the plurality of division values comprise multiples of the period value.

18. The signal converter of claim 16, wherein the signal dividing unit comprises:
a plurality of dividers suitable for dividing the input signal by different division values, respectively; and
a division ratio selector suitable for selecting any one of output signal of the respective dividers in response to the detection signal.

* * * * *